United States Patent
Kuroda

[19]

[11] Patent Number: 6,147,383
[45] Date of Patent: *Nov. 14, 2000

[54] LDD BURIED CHANNEL FIELD EFFECT SEMICONDUCTOR DEVICE AND MANUFACTURING METHOD

[75] Inventor: Hideaki Kuroda, Kanagawa, Japan

[73] Assignee: Sony Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/611,188

[22] Filed: Mar. 5, 1996

[30] Foreign Application Priority Data

Mar. 10, 1995 [JP] Japan .................................. 7-079525

[51] Int. Cl.[7] .......................... H01L 29/76; H01L 29/94; H01L 31/062
[52] U.S. Cl. .......................... 257/344; 257/345; 257/408
[58] Field of Search .................................. 257/335, 344, 257/345, 402, 403, 404, 408

[56] References Cited

U.S. PATENT DOCUMENTS 4,771,012  9/1988  Yabu et al. .............................. 257/344
5,102,816  4/1992  Manukonda et al. .................... 257/344
5,266,823  11/1993  Noji et al. ............................... 257/344

*Primary Examiner*—Steven H. Loke
*Attorney, Agent, or Firm*—Hill & Simpson

[57] ABSTRACT

An LDD-structured field-effect semiconductor device that can eliminate fluctuations in the threshold voltage caused by variations in the position of higher-density diffusion layers, thereby suppressing variations in the threshold voltage to a lower level. The junction depth of each of the lower-density diffusion layers in contact with a substrate is greater than the depth of a depletion layer at the place corresponding to a portion of the channel region contacting the source region. This prevents a change in the positional relationship between diffusion layers serving as, what are referred to as "pocket layers", and the depletion layer adjacent to the source, even though the position of the higher-density diffusion layers is varied in the longitudinal direction of the channel due to variations in the width of a spacer. Thus, there are no fluctuations in the quantity of impurities contained in the pocket layers within the depletion layer adjacent to the source, which would otherwise influence the threshold voltage.

3 Claims, 3 Drawing Sheets

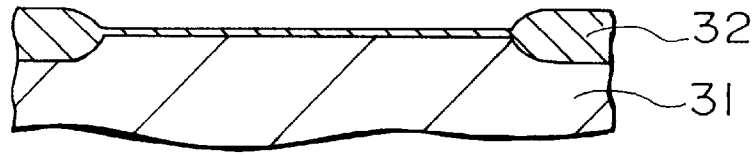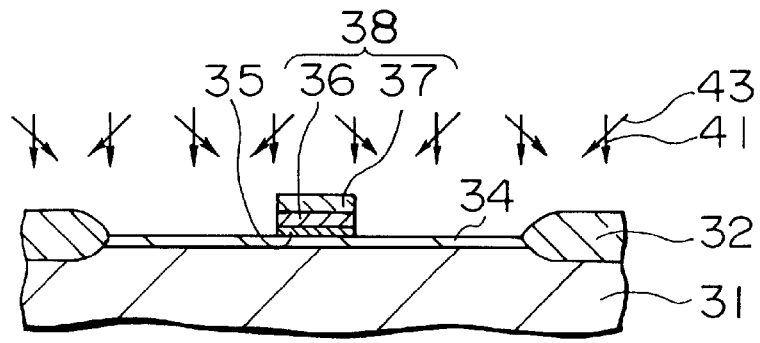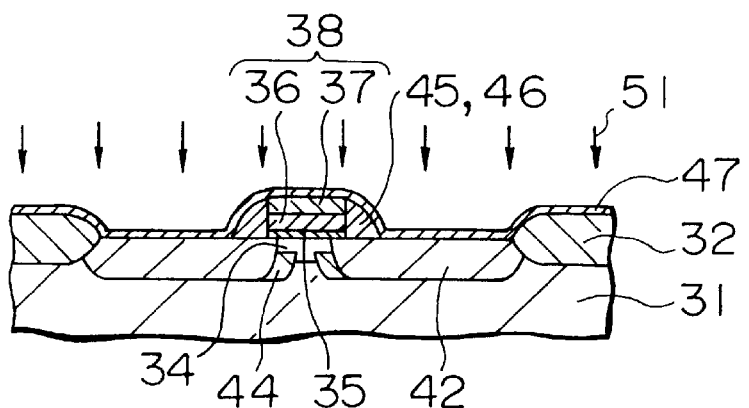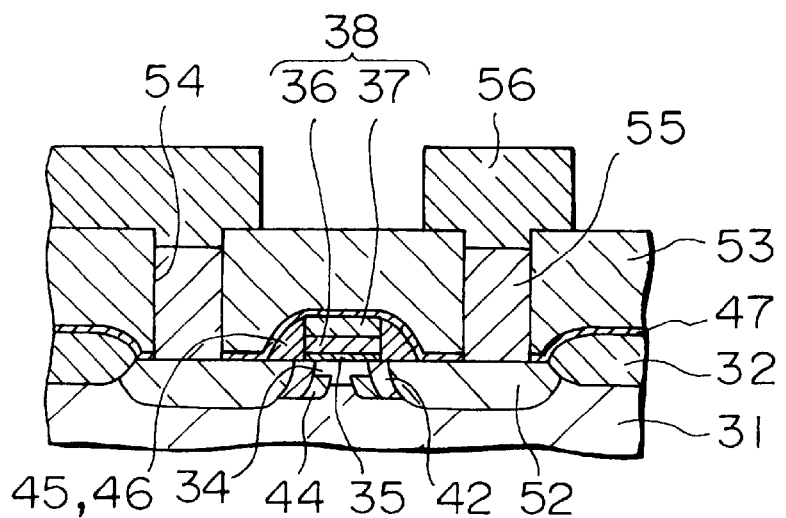

LDD BURIED CHANNEL FIELD EFFECT SEMICONDUCTOR DEVICE AND MANUFACTURING METHOD

BACKGROUND OF THE INVENTION

1. Field of the Invention

The present invention relates to a lightly doped drain (LDD)-structured and buried channel-type field-effect semiconductor device having, what is referred to as "a pocket layer". The invention also relates to a method of manufacturing the semiconductor device.

2. Description of the Related Art

FIG. 3 illustrates an example of a conventional p-channel transistor of the above type. In this transistor, a $p^{--}$-type diffusion layer 12 for making adjustments to the threshold voltage is deposited in the vicinity of the surface of an $n^-$-type Si substrate 11. A $SiO_2$ film 13, serving as a gate oxide film, is further formed on the surface of the Si substrate 11.

An n-type impurity-doped polycrystal Si film 14 and a $WSi_x$ film are stacked on the $SiO_2$ film 13 and patterned so as to form a gate electrode 16. An impurity is ion-implanted through a mask formed of the gate electrode 16 so as to form $p^-$-type diffusion layers 17. An impurity is further implanted through the gate electrode 16 and the like used as a mask according to an obliquely rotational ion implantation method so as to form n-type diffusion layers 21 which are referred to as "pocket layers".

A spacer 23 formed of a $SiO_2$ film 22 is formed on the lateral surface of the gate electrode 16. $P^+$-type diffusion layers 24 are formed by impurity ion implantation through a mask formed of the gate electrode 16 and the spacer 23. When the transistor is in the conducting state without the application of an energizing voltage to the transistor's drain, a depletion layer 25 is formed in a region surrounded by the dotted line shown in FIG. 3, the diffusion layers 17 and 24 and the $SiO_2$ film 13.

Variations in the thickness of the $SiO_2$ film 22 deposited according to the CVD process and variations in the amount of etch back with respect to the $SiO_2$ film 22 further cause variations in the width of the spacer 23. In particular, as illustrated in FIG. 4, the $SiO_2$ film 22 is deposited according to the CVD process so that the thickness $d_1$ of a region of the film in which the gate electrodes 16 are sparsely disposed is larger than the thickness $d_2$ of a region of the film in which the gate electrodes 16 are densely arranged. Accordingly, variations in the width of the spacer 23 are affected mostly by the dependency of the thickness of the $SiO_2$ film 22 on the density of the gate electrodes 16.

On the other hand, the diffusion layers 24 are produced by ion implantation through a mask formed of the gate electrode 16, the spacer 23, and so on, as described above. Accordingly, variations in the width of the spacer 23 further bring about variations in the position of the diffusion layers 24 in the longitudinal direction of the channel. Also, if the gate length of a buried channel transistor is not longer than approximately 0.4 $\mu$m, the diffusion layers 21 serving as pocket layers are essential in order to inhibit the short channel effect.

As is clearly seen from FIG. 3, however, variations in the position of the diffusion layers 24 in the longitudinal direction of the channel change the positional relationship between the diffusion layers 21 and the depletion layer 25, which further varies the amount of impurities contained in the diffusion layers 21 within the depletion layer 25. This varies the threshold voltage of the transistor, thereby causing a yield reduction of transistors, as well as increasing the current during standby.

SUMMARY OF THE INVENTION

Accordingly, in order to solve the above-described problems, it is an object of the present invention to provide a field-effect semiconductor device that can eliminate fluctuations in the threshold voltage caused by variations in the position of higher-density diffusion layers so as to decrease variations in the threshold voltage.

In order to achieve the above object, according to one aspect of the present invention, there is provided a buried-channel field-effect semiconductor device comprising: first diffusion layers having a comparatively low density in contact with a channel region; second diffusion layers having a comparatively high density located on the opposite side of the channel region and in contact with the first diffusion layers, respectively, one pair of the first and second diffusion layers forming a source region, and another pair of the first and second diffusion layers forming a drain region, the first and second diffusion layers being disposed within a semiconductor substrate; and a third diffusion layer having substantially the same conductivity as the semiconductor substrate and having a higher density of impurities than the semiconductor substrate, the third diffusion layer being disposed in the channel region in such a manner that it is in contact with the first diffusion layers, wherein the junction depth of each of the first diffusion layers is greater than the depth of a depletion layer at the place corresponding to a portion of the channel region contacting the source region.

According to another aspect of the present invention, there is provided a buried-channel field-effect semiconductor device comprising: first diffusion layers having a comparatively low density in contact with a channel region; second diffusion layers having a comparatively high density located on the opposite side of the channel region and in contact with the first diffusion layers, one pair of the first and second diffusion layers forming a source region, and another pair of the first and second diffusion layers forming a drain region, the first and second diffusion layers being disposed within a semiconductor substrate; and a third diffusion layer having substantially the same conductivity as the semiconductor substrate and having a higher density of impurities than the semiconductor substrate, the third diffusion layer being disposed in the channel region in such a manner that it contacts the first diffusion layers, wherein the junction depth of each of the first diffusion layers is greater than the junction depth of each of the second diffusion layers.

According to still another aspect of the present invention, there is provided a method of manufacturing a buried-channel field-effect semiconductor device which comprises: first diffusion layers having a comparatively low density in contact with a channel region; second diffusion layers having a comparatively high density located on the opposite side of the channel region and in contact with the first diffusion layers, respectively, one pair of the first and second diffusion layers forming a source region, and another pair of diffusion layers forming a drain region, the first and second diffusion layers being disposed within a semiconductor substrate; and a third diffusion layer having substantially the same conductivity as the semiconductor substrate and having a higher density of impurities than the semiconductor substrate, the third diffusion layer being disposed in the channel region in such a manner that it contacts the first diffusion layer, the method comprising the step of repeating ion implantation a plurality of times by different projected ranges so as to form the first diffusion layers.

BRIEF DESCRIPTION OF THE DRAWINGS

FIG. 2, which is comprised of FIGS. 2A to 2D, is a sectional side elevation illustrating manufacturing steps of an embodiment of the present invention;

DESCRIPTION OF THE PREFERRED EMBODIMENTS

Figure 1:
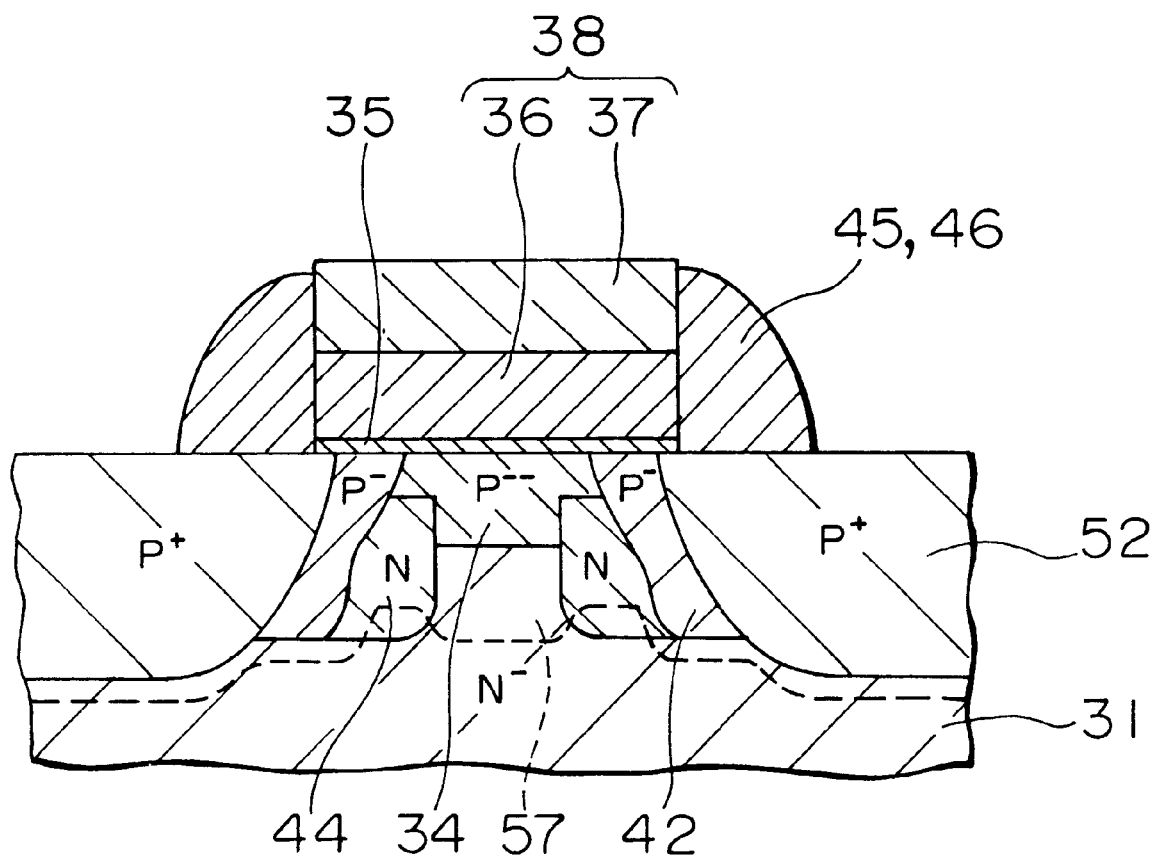
FIG. 1 is an enlarged sectional side elevation of an embodiment of the present invention.
Figure 3:
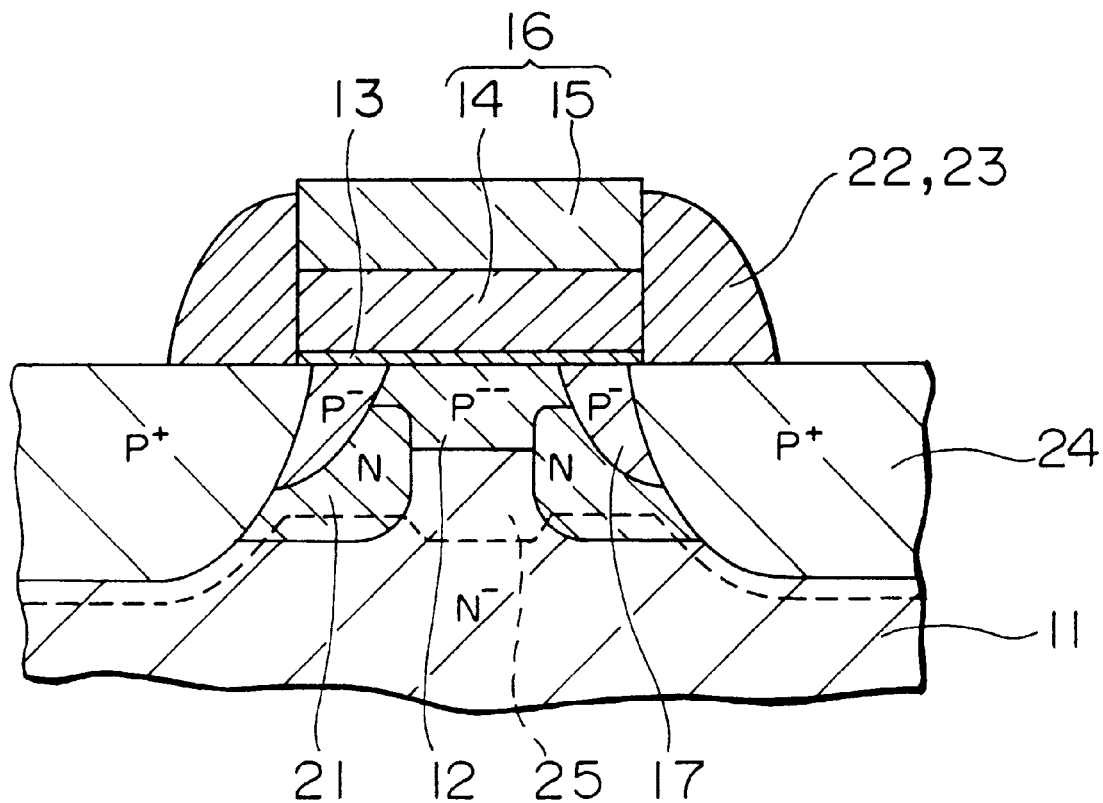
FIG. 3 is an enlarged sectional side elevation of an example of conventional field-effect semiconductor devices.
Figure 4:
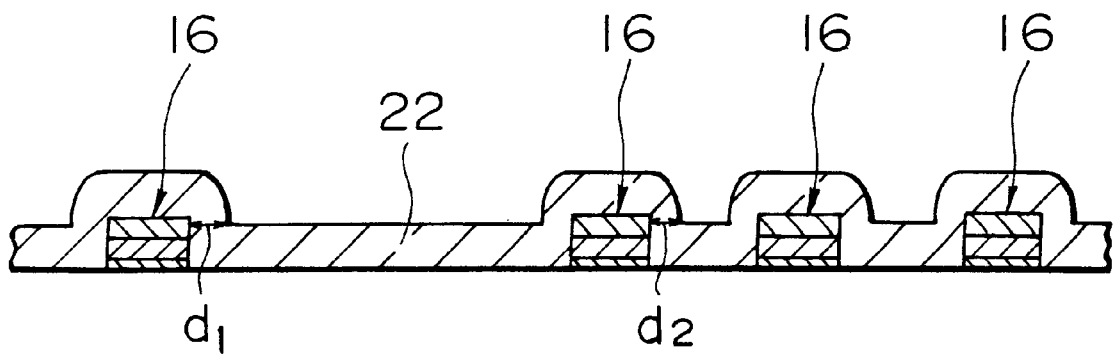
FIG. 4 is a sectional side elevation used for illustrating the problems inherent in an example of conventional field-effect semiconductor devices.

A description will now be given of an embodiment of the present invention applied to a p-channel transistor with reference to FIGS. 1 and 2. A semiconductor device of this embodiment is manufactured by the following steps. A $SiO_2$ film 32 is first formed in a chip separating region of an $n^-$-type Si substrate 31 according to a method, such as a localized oxidation of silicon (LOCOS) process or the like. Subsequently, an impurity 33 for adjusting the threshold voltage is ion-implanted into and in the vicinity of the surface of the device-active region. The $p^{--}$-type diffusion layer 34 is thus formed, as shown in FIG. 1.

Then, as illustrated in FIG. 2B, after a $SiO_2$ film 35 serving as a gate oxide film is caused to grow on the surface of the device-active region, an n-type impurity-doped polysilicon Si film 36, a $WSi_x$ film 37 and the like are sequentially deposited and patterned, thereby forming a gate electrode 38. An impurity 41 is ion-implanted at an angle of from 0 to 7° through a mask formed of the gate electrode 38 and the $SiO_2$ film 32, whereby $p^-$-type diffusion layers 42 are formed, as shown in FIG. 2C. This ion implantation is performed at an acceleration energy of approximately from 10 to 50 keV by doses of approximately from $10^{12}$ to $10^{14}$ $cm^{-2}$. The ion implantation is also carried out for two stages in which $BF_2^+$ is implanted as the impurity 41 for a first stage and $B^+$ is used as the impurity 41 for a second stage. This method makes it possible to form deep diffusion layers 42 while preventing the diffusion of the impurity 41 along the channel.

An impurity 43, such as $As^+$ or $P^+$, is implanted at an acceleration energy of approximately from several tens to several hundreds of keV by doses of approximately $10^{12}$ to $10^{14}$ $cm^{-2}$ through a mask formed of the gate electrode 38 and the $SiO_2$ film 32 according to an obliquely-rotational ion implantation method. N-type diffusion layers 44 are thus formed as pocket layers, as shown in FIG. 2C.

Then, as shown in FIG. 2C, a $SiO_2$ film 45 having a thickness of from several tens to several hundreds of nm is deposited according to the CVD process, and etch back is performed on the overall surface of the $SiO_2$ film 45. This produces a spacer 46 formed of this $SiO_2$ film 45 on the lateral surface of the gate electrode 38. Further, for pollution prevention, a $SiO_2$ film 47 having a thickness of several tens of nm is caused to grow on the overall surfaces of the $SiO_2$ film 32, the spacer 45 and the gate electrode 38. Subsequently, with the use of a mask consisting of the gate electrode 38, the spacer 46 and the $SiO_2$ film 32, $BF_{2+}$ used as an impurity 51 is ion-implanted at an acceleration energy of approximately from 10 to 50 keV by doses of approximately from $10^{15}$ to $10^{16}$ $cm^{-2}$. $P^+$-type layers 52 are thus formed, as shown in FIG. 2D.

After annealing is performed for activating impurities contained in the diffusion layers 52 and so on, an interlayer insulating film 53 having a thickness of several hundreds of nm is deposited according to the CVD process, as shown in FIG. 2D, and a contact hole 54 is opened in the interlayer insulating film 53 until it reaches the diffusion layers 52. The contact hole 54 is then filled with a tungsten plug 55, followed by patterning Al wiring 56, and a known process is further performed, thereby accomplishing the formation of this transistor.

Although the junction depth of each of the diffusion layers 42 in contact with the Si substrate 31 is shown substantially equal to that of the diffusion layers 52 in contact with the Si substrate 31 in FIG. 2D, the former may be deeper than the latter. In either case, even though the position of the diffusion layers 52 is varied in the longitudinal direction of the channel due to variations in the width of the spacer 46, there is no change in the positional relationship between the diffusion layers 44 and a depletion layer, which further makes it possible to keep the amount of impurities of the diffusion layers 44 within the depletion layer unchangeable. Accordingly, there are no fluctuations in the threshold voltage caused by variations in the width of the spacer 46, thereby inhibiting variations in the threshold voltage to a lower level.

Also, as shown in FIG. 1, even though the junction depth of each of the diffusion layers 42 contacting the Si substrate 31 is smaller than that of the diffusion layers 52 in contact with the Si substrate 31, variations in the position of the diffusion layers 52 in the longitudinal direction do not change the positional relationship between the diffusion layers 44 and the depletion layer 57 under the following condition. Namely, the junction depth of each of the diffusion layers 42 in contact with the Si substrate 31 is greater than the depth of the depletion layer 57 at the place corresponding to a portion of the channel region contacting the source region. This does not fluctuate the amount of impurities contained in the diffusion layers 44 within the depletion layer 57, which inhibits a change in the threshold voltage caused by variations in the width of the spacer 46, thereby suppressing variations in the threshold voltage to a lower level.

Although the foregoing embodiment has been discussed in which this invention is applied to a p-channel transistor, it may be applicable to a buried n-channel transistor having a p-type gate electrode.

As will be clearly understood from the foregoing description, the present invention offers the following advantages.

According to the field-effect semiconductor device of the present invention, any variations in the position of second higher-density diffusion layers in the longitudinal direction of the channel do not change the positional relationship between third diffusion layers functioning as, what are referred to as, "pocket layers" and a depletion layer. Because of this, there is no change in the quantity of impurities contained in the pocket layers within the depletion layer adjacent to the source region, which would otherwise adversely influence the threshold voltage. Hence, the threshold voltage caused by variations in the position of the second higher-density diffusion layers can be kept unchanged. As a consequence, variations in the threshold voltage can be suppressed to a lower level.

Also, according to the manufacturing method of the above-described field-effect semiconductor device, the junction depth of each of the first lower-density diffusion layers in contact with a Si substrate can be easily made greater than the depth of the depletion layer at the place corresponding to a portion of the channel region contacting the source or than the junction depth of each of the second higher-density diffusion layers in contact with the Si substrate. It is thus possible to readily manufacture a field-effect semiconductor device having smaller variations in the threshold voltage.

What is claimed is:

1. A buried-channel field-effect semiconductor device having source and drain regions on opposite sides of a channel region, comprising:

a semiconductor substrate of a first conductivity type;

a first diffusion layer having a comparatively low impurity density and being of a second conductivity type opposite that of the semiconductor substrate, said first diffusion layer being in contact with said channel region, and formed at least on a side of a source region;

a pair of second diffusion layers having a comparatively high impurity density and being of said second conductivity type, said second diffusion layers located on opposite sides of said channel region and at least one of said second diffusion layers being in contact with said first diffusion layer on a first side of said channel region, said first and second diffusion layers which are located on said first side of the channel region forming a source region, and said second diffusion layer located on a second side of the channel region forming a drain region, said first and second diffusion layers being disposed within said semiconductor substrate; and a third diffusion layer being a pocket layer and having the same conductivity type as said semiconductor substrate and having a higher density of impurities than said semiconductor substrate, said third diffusion layer being in contact with said first diffusion layer and positioned between said first diffusion layer and said channel region, wherein, a junction depth of said first diffusion layer is greater than a depth of a depletion layer located below a place corresponding to a portion of said channel region in contact with said source region, and the first, second and third diffusion layers on said first side of said channel region are not formed beneath a central region of a gate electrode formed over the substrate.

2. The field effect semiconductor device of claim 1, wherein a junction depth of the first diffusion layer is greater than a junction depth of the second diffusion layers.

3. The field effect semiconductor device of claim 1, wherein a junction depth of the first diffusion layer is the same depth as a junction depth of the third diffusion layer.

* * * * *